(12) United States Patent
Gisin et al.

(10) Patent No.: US 7,249,337 B2
(45) Date of Patent: Jul. 24, 2007

(54) METHOD FOR OPTIMIZING HIGH FREQUENCY PERFORMANCE OF VIA STRUCTURES

(75) Inventors: Franz Gisin, San Jose, CA (US);
William Panos, San Jose, CA (US);
Mahamud Khandokar, Pleasanton, CA (US)

(73) Assignee: Sanmina-SCI Corporation, San Jose, CA (US)

( * ) Notice: Subject to any disclaimer, the term of this patent is extended or adjusted under 35 U.S.C. 154(b) by 410 days.

(21) Appl. No.: 10/383,139

(22) Filed: Mar. 6, 2003

(65) Prior Publication Data

US 2004/0176938 A1 Sep. 9, 2004

(51) Int. Cl.
*H03K 17/693* (2006.01)
*H02B 1/00* (2006.01)
*H01L 23/02* (2006.01)

(52) U.S. Cl. .................. 716/15; 716/1; 716/2; 716/4; 361/600; 257/678

(58) Field of Classification Search .............. 716/1, 716/2, 4, 15; 703/14; 361/753, 760, 800, 361/816, 818; 257/691, 724
See application file for complete search history.

(56) References Cited

U.S. PATENT DOCUMENTS

| | | | | |
|---|---|---|---|---|
| 5,524,281 | A * | 6/1996 | Bradley et al. | 455/67.15 |
| 6,539,531 | B2 * | 3/2003 | Miller et al. | 716/15 |
| 6,674,338 | B2 * | 1/2004 | Novak | 333/32 |
| 6,845,491 | B2 * | 1/2005 | Miller et al. | 716/1 |
| 6,870,252 | B2 * | 3/2005 | Novak et al. | 257/691 |
| 2005/0125751 | A1 * | 6/2005 | Miller et al. | 716/4 |

OTHER PUBLICATIONS

Low et al., "Via design optimisation for high speed device packaging", Dec. 8-10, 1998, Electronics Packaging Technology Conference, 1998. Proceedings of 2nd, pp. 112-118☐☐.*

Du Meizhu et al., "Via design in multi-layer PCB", Nov. 4-7, 2003, Environmental Electromagnetics, 2003. CEEM 2003. Proceedings. Asia-Pacific Conference on, pp. 94-98.*

Xiaoning et al., "EMI mitigation with multilayer power-bus stacks and via stitching of reference planes", Nov. 2001, Electromagnetic Compatibility, IEEE Transactions on, vol. 43, Issue 4, pp. 538-548 ☐☐.*

(Continued)

*Primary Examiner*—Jack Chiang
*Assistant Examiner*—Helen Rossoshek
(74) *Attorney, Agent, or Firm*—Perkins Coie LLP

(57) ABSTRACT

A method for enhancing the high frequency signal integrity performance of a printed circuit board (PCB) or backplane is provided. According to one embodiment of the present invention, the method involves the use of S-parameters as the primary cost factors associated with an iterative process to optimize the physical dimensions and shape of a single or a collection of vias within the PCB or backplane. In certain embodiments, the process involves the representation of the via components as equivalent lumped series admittances and impedances, as well as, RLGC sub-circuits upon which basic circuit analysis is performed to optimize secondary characteristics, for example, the maximization of the sub-circuit's resistance and/or the minimization of the sub-circuit's capacitance. The iterative process involves the alteration of physical dimensions and the shape of the via components such that the secondary characteristics are optimized.

10 Claims, 7 Drawing Sheets

OTHER PUBLICATIONS

Pak et al., "PCB power/ground plane edge radiation excited by high-frequency clock", Aug. 9-13, 2004, Electromagnetic Compatibility, 2004, EMC 2004. 2004 InternationalSymposium on, vol. 1, pp. 197-202 vol. 1.*

Sercu et al., "Accurate de-embedding of the contribution of the test boards to the high-frequency characteristics of backplane connectors", Oct. 27-29, 1997 Electrical Performance of Electronic Packaging, IEEE 6th Topical Meeting on pp. 177-180.*

Shi, et al., "Simulation and measurement for decoupling on multilayer PCB DC power buses", Aug. 19-23, 1996, Electromagnetic Compatibility, 1996. Symposium Record. IEEE 1996 International Symposium on, pp. 430-435 □□.*

Pajares et al., "Circuit model for mode conversion in grounded differential signal paths", Aug. 9-13, 2004, Electromagnetic Compatibility, 2004. EMC 2004. 2004 InternationalSymposium on, vol. 2, pp. 392-395 vol. 2□□.*

Orhanovic et al., "High frequency equivalent circuit model of via", Oct. 26-28, 1998, Electrical Performance of Electronic Packaging, 1998, IEEE 7th topical Meeting on Oct. 26-28, 1998 pp. 152-155 □□.*

Young-Seok et al., "Analysis for complex power distribution networks considering densely populated vias", Mar. 21-23, 2005, Quality of Electronic Design, 2005. ISQED 2005. Sixth International Symposium on, pp. 208-212.*

Nov. 2001, *Electronic Engineering*, "Challenges for Achieving 10Gbps Copper Backplanes", Robert Cutler.

Dec. 2, 2002, "Sanmina-SCI Develops Opti-Via ™ Technology for Improved Signal Integrity at Higher Frequencies: Advanced Technology Enables 10Gb/s Data Rates Over Copper Conductors", Press Release.

Oct. 16, 2002, "Designing a Robust 40 Gb/s Copper Backplane Interconnect System", Franz Gisin, Presented Dallas, Tx.

* cited by examiner

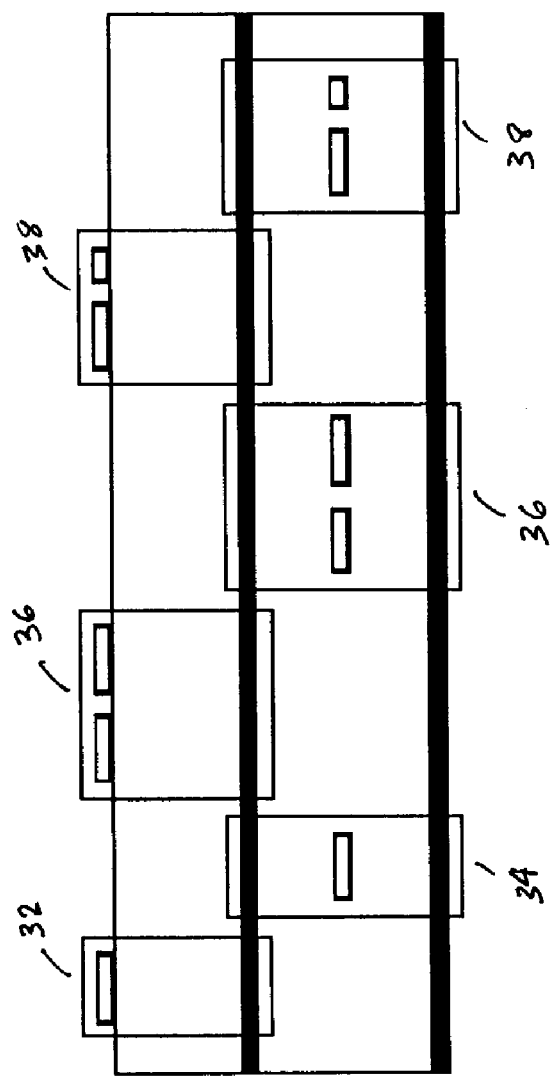
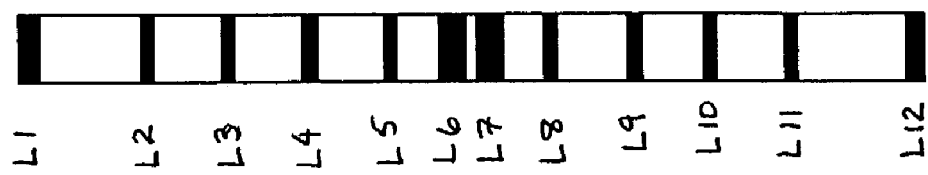
FIGURE 3

METHOD FOR OPTIMIZING HIGH FREQUENCY PERFORMANCE OF VIA STRUCTURES

BACKGROUND OF THE INVENTION

This invention generally relates to a method for assuring enhanced signal integrity in various electronic components operating at higher frequencies. In particular, the present invention relates to a method for optimizing via structures in such components. More particularly, the present invention relates to a method for optimizing via structures for the enhanced high frequency performance of printed circuit boards and backplanes.

Today's electronic products, including computers, cellular telephones, and networking systems operate at ever increasing transmission data rates. At higher transmission data rates, resistance, dielectric absorption, and radiation losses, cross-talk, and structural resonances of passive interconnects can significantly degrade the quality of signals propagating through the interconnect. One of the primary circuit elements that attenuates and distorts analog, radio frequency and digital signals is the via. Via signal degradation is frequency/data rate dependent.

Numerous techniques have been used to mitigate the signal degradation problem including backdrilling of via stubs and removal of non-functional pads. These techniques, however, have seen limited, and to some extent, been subjectively applied in an attempt to improve the signal integrity of complex printed circuit boards and backplanes. It is, therefore, desirable to provide an objective, cost-effective method for the optimization of the shape and size of each via structure within such a printed circuit board or backplane. Additionally, it is desirable to provide such a method that is capable of being applied to other elements of an existing circuitry, such as collections of interconnect components (i.e., backplane assemblies that include vias, traces, and connectors) so as to enhance the circuit's overall signal integrity performance and thus its effectiveness for use at higher operating frequencies.

SUMMARY OF THE INVENTION

The present invention recognizes and addresses various of the foregoing limitations and drawbacks, and others, concerning prior art techniques aimed at improving high frequency performance for electronic circuitry Therefore, the present invention is directed to a method for optimizing via structures for the enhanced high frequency performance of printed circuit boards and backplanes.

It is, therefore, a principle object of the subject invention to provide a method of improving signal integrity performance of high frequency electrical circuits. More particularly, it is an object of the present invention to provide a method for optimizing at least one element of a circuit to improve its high frequency signal integrity performance. In such context, it is still a more particular object of the present invention to provide a method for optimizing a via structure's size and shape to enhance its high frequency signal integrity performance.

Still further, it is a principle object of this invention to provide a cost-effective optimization methodology for improving the signal integrity of an electrical circuit. In such context, it is an object of the present invention to provide a cost-effective methodology for improving the high frequency signal integrity performance of a via structure.

Additional objects and advantages of the invention are set forth in, or will be apparent to those of ordinary skill in the art from, the detailed description as follows. Also, it should be further appreciated that modifications and variations to the specifically illustrated and discussed features, method steps, and materials hereof may be practiced in various embodiments and uses of this invention without departing from the spirit and scope thereof, by virtue of present reference thereto. Such variations may include, but are not limited to, substitutions of the equivalent means, features, method steps, and materials for those shown or discussed, and the functional or positional reversal of various parts, features, method steps or the like.

Still further, it is to be understood that different embodiments, as well as different presently preferred embodiments, of this invention, may include various combinations or configurations of presently disclosed features, elements, method steps or their equivalents (including combinations of features or configurations thereof not expressly shown in the figures or stated in the detailed description).

These and other features, aspects and advantages of the present invention will become better understood with reference to the following descriptions and appended claims. The accompanying drawings, which are incorporated in and constitute a part of this specification, illustrate an embodiment of the invention and, together with the descriptions, serve to explain the principles of the invention.

In one exemplary embodiment, there may be provided an interactive method of optimization for manipulating the physical characteristics of a single or multiple vias within a PCB or backplane to enhance their high frequency performance. In general, such method involves subdividing the via into one or more of the following three different kinds of sections: a transmission line bend section, a non-uniform transmission line thru section, and a loaded non-uniform transmission line stub section. Where possible the PCB stackup should be designed so the stub section lengths (if any are present) are minimized.

The transmission line bend sections may be converted into lumped element series impedances and shunt element admittances. The physical dimensions of the bend section components may be adjusted until several second-level characteristics of the section's electrically equivalent sub-circuits are optimized. In the case of a single via, such optimization of a transmission line bend section is generally equivalent to minimizing the magnitude of the lumped element series impedances and shunt element admittances.

Further, the non-uniform transmission line thru sections may be converted into a series of discretized RLGC sub-circuits comprising one or more resistors, R, inductors, L, conductors, G, and capacitors, C. The physical dimensions of the thru section components associated with each sub-circuit may be manipulated until the values of R, L, G, and C are optimized. In the case of a single via, such optimization of a non-uniform transmission line thru section is generally equivalent to either 1) making the individual R, L, G, and C and associated discretized characteristic impedance values between adjacent sub-circuits as equal as possible, or 2) making the product of the series impedances and the shunt admittances as equal as possible.

Further still, the non-uniform stub transmission line sections may be converted into a series of discretized RLGC sub-circuits. The physical dimensions of the stub section components associated with each sub-circuit may be manipulated until the values of R, L, G, and C are optimized. In the case of a single via, such optimization of a non-uniform stub transmission line section is generally equivalent to making the magnitudes of series R and series L as large as possible and the magnitudes of shunt G and shunt C as small as possible.

Finally, the S-parameters of the via structure after optimization may be calculated to verify the optimization results. The present invention allows for constraints on the continued manipulation of the physical characteristics of the vias to avoid minute improvements in performance at exponentially greater and greater monetary costs.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 3 is a baseline cross-sectional view of a printed circuit board indicating the individual internal layers and a corresponding partial cross-sectional view showing microstrip and stripline transmission line cross sections for the upper three layers of such printed circuit board;

Figure 1:
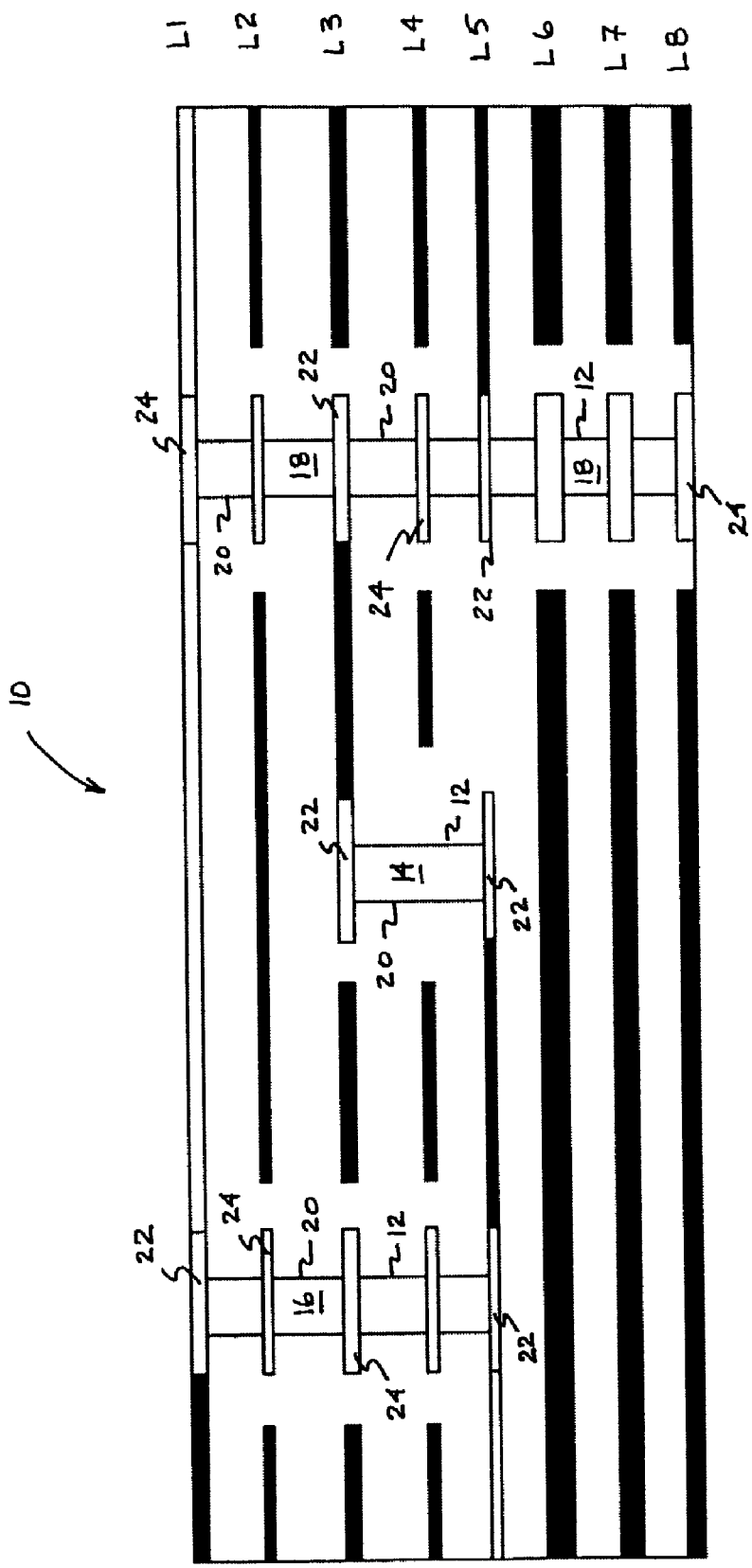
FIG. 1 is a pair of cross-sectional views of a standard printed circuit board showing the individual internal layers and a corresponding view showing the internal connections between the layers including a plurality of vias.

Repeat use of reference characters throughout the present specification and appended drawings is intended to represent the same or analogous features or elements of the invention.

DETAILED DESCRIPTION OF THE PREFERRED EMBODIMENTS

Reference will now be made in detail to presently preferred embodiments of the invention, examples of which are fully represented in the accompanying drawings. Such examples are provided by way of an explanation of the invention, not limitation thereof. In fact, it will be apparent to those skilled in the art that various modifications and variations can be made in the present invention, without departing from the spirit and scope thereof. For instance, features illustrated or described as part of one embodiment can be used on another embodiment to yield a still further embodiment. Still further, variations in selection of materials and/or characteristics may be practiced, to satisfy particular desired user criteria. Thus, it is intended that the present invention cover such modifications and variations as come within the scope of the present features and their equivalents.

As disclosed above, the present invention is particularly concerned with a method for optimizing via structures for the enhanced high frequency performance of printed circuit boards and backplanes 10. Vias 12 degrade the signal integrity performance of printed circuit board interconnects because they attenuate and distort analog, radio frequency, and digital signals that propagate through them. The present invention may be used to optimize individual component structures that make up a via 12, a collection of vias 12, and even higher level interconnects such as printed circuit boards and backplane assemblies 10 containing vias 12, interconnected traces, and connectors.

FIG. 1 shows a cross-section of a typical multi-layer printed circuit board 10 (PCB) with a plurality of vias 12. A multi-layer PCB 10 is a printed board that consists of two or more planar conductive layers (L1, L2, L3, etc.) separated by one or more rigid or flexible planar insulating dielectric layers bonded together and electrically interconnected. An electrical connection between two or more patterns on different conductive layers is known as a via 12. A buried via 14 is one that does not extend to the outer layers of a PCB 10. A blind via 16 extends only to one outer layer. Blind and buried vias 14 and 16 are also known as interstitial vias. A plated through hole 18 (PTH) via extends through the entire PCB 10 (from the top outer layer to the bottom outer layer) and is capable of making electrical connection between conductive patterns on internal layers, external layers, or both.

A via 12, regardless of its location, includes a number of components. At the least a via 12 includes a barrel 20 and one or more functional 22 or non-functional 24 pads. Where applicable, a via 12 may include a clearance region 26 (also called an anti-pad region) on those layers where the via 12 intersects that layer but must be electrically isolated from any conductive patterns located on such layer. A pad 22 or 24 is a localized conductive pattern that is electrically attached to the via 12. If the pad 22 is also electrically connected to a conductive pattern (i.e., a signal trace, a ground or voltage plane, or a passive device, etc.) then it is a functional pad 22.

Figure 2:
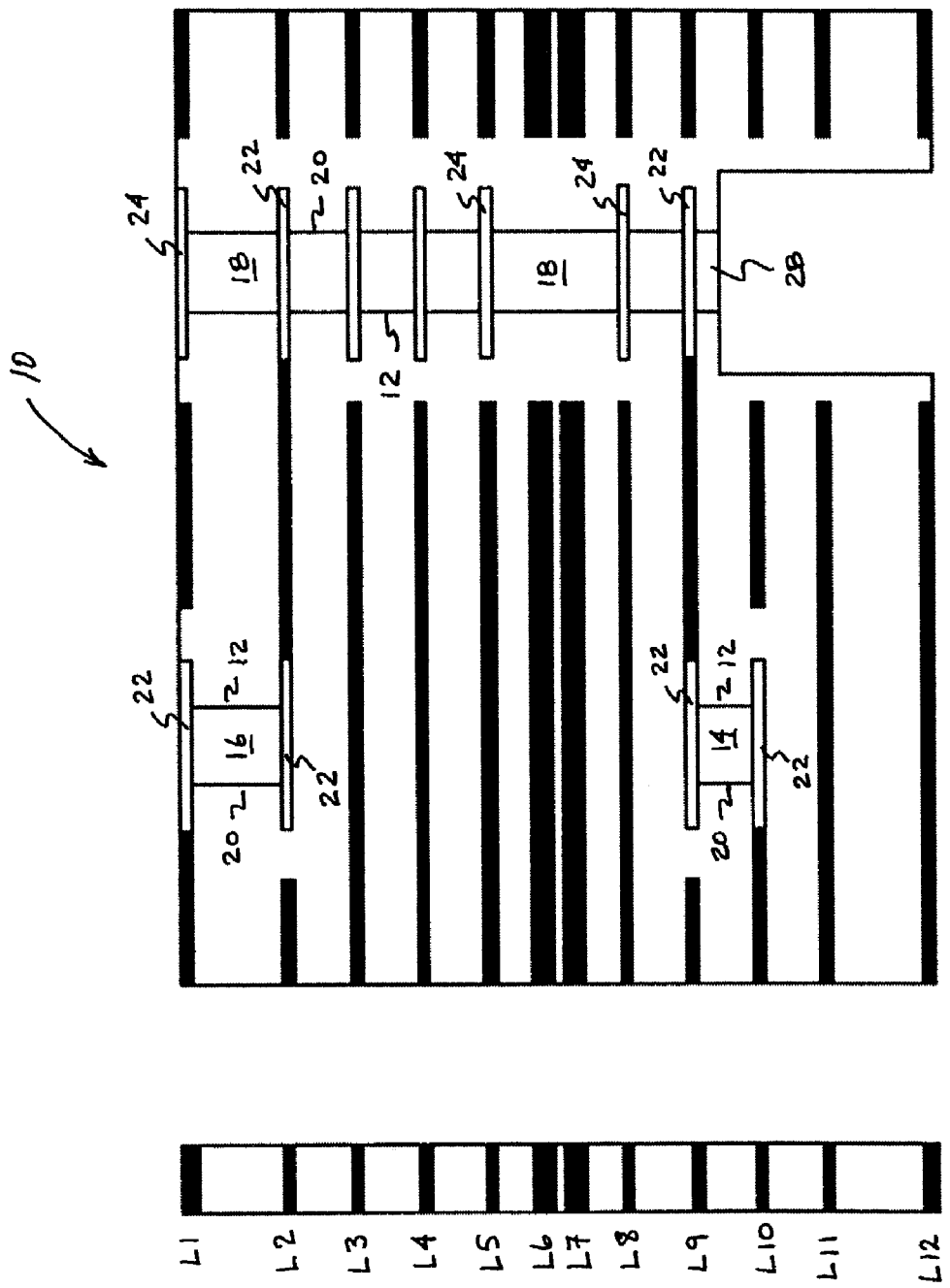
FIG. 2 is a pair of cross-sectional views of a printed circuit board as in FIG. 1 with prior art modifications to the via structures for the enhancement of signal integrity performance.

FIG. 2 shows two methods currently in use to improve the signal integrity performance of a via 12. It is common practice to remove non-functional pads 24 as a way to enhance the signal integrity performance of the via 12. It is also common practice to remove the unused "stub" sections 28 of PTH vias 18 by backdrilling out the conductive portion of the via 12 that makes up the stub section 28.

There are many problems with arbitrarily utilizing these commonly accepted methods without an optimization effort for each via 12 or the collection of vias 12 with a PCB or backplane 10. There are situations where removing some of the non-functional pads actually degrades rather than improves signal integrity performance.

The method of the present invention involves subdividing the via 12 into one or more of the following three different kinds of sections: a transmission line bend section, a non-uniform transmission line thru section, and a loaded non-uniform transmission line stub section. Where possible the PCB stackup 10 should be designed so the stub section lengths 28 are minimized. The transmission line bend sections may be converted into lumped element series impedances and shunt element admittances, which are monotonically related to the scalable S-parameters of the circuitry including the non-optimized via 12. Thus the iterative steps used in the process may be based on a straightforward sequential convergence algorithm.

The physical dimensions of the bend section components may be adjusted until several second-level characteristics of the section's electrically equivalent sub-circuit are optimized. Non-uniform transmission line thru sections and non-uniform stub transmission line sections may be converted into a series of discretized RLGC sub-circuits (see FIGS. 4–6). The physical dimensions of the thru section components associated with each sub-circuit may be manipulated until the values of R, L, G, and C are optimized.

To accomplish these conversions, signal traces and adjacent conductive plane regions may be formed into planar transmission lines as seen in FIG. 3. A planar transmission line is a wave-guiding structure whose fundamental mode of propagation along the transmission line is essentially a transverse electromagnetic wave. Planar transmission lines suitable for transmission of high frequency or narrow pulse electrical signals have defined conductor and dielectric material dimensions and shapes that are uniform along their length. Transmission lines can be described by an equivalent electrical circuit composed of distributed resistance, inductance, conductance, and capacitance elements (i.e., an RLGC sub-circuit). A microstrip transmission line 32 configuration consists of a conductor that is positioned over and parallel to a conductive plane with a dielectric therebetween. A stripline transmission line 34 configuration consists of a conductor that is positioned between and parallel to two conductive planes with a dielectric among them. A balanced transmission line 36 is a two-conductor transmission line that has distributed resistance, inductance, conductance, and capacitance elements equally distributed between its conductors. An unbalanced transmission line 38 is a transmission line that has distributed resistance, inductance, conductance, and capacitance elements not equally distributed between its conductors. Non-equal trace widths are one way to create an unbalanced transmission line 38. It is common practice to denote the signal trace layer as the reference layer for microstrip 32 and stripline 34 transmission line structures. In FIG. 3, the single ended microstrip, the balanced differential microstrip, and the unbalanced differential microstrip are located on layer L1, even though the conductive plane on L2 forms part of the transmission line structure. In a similar fashion, the single-ended stripline, balanced differential stripline, and unbalanced differential stripline are located on L3, even though the conductive planes on layers L2 and L4 also form part of the transmission line structure.

Figure 4:
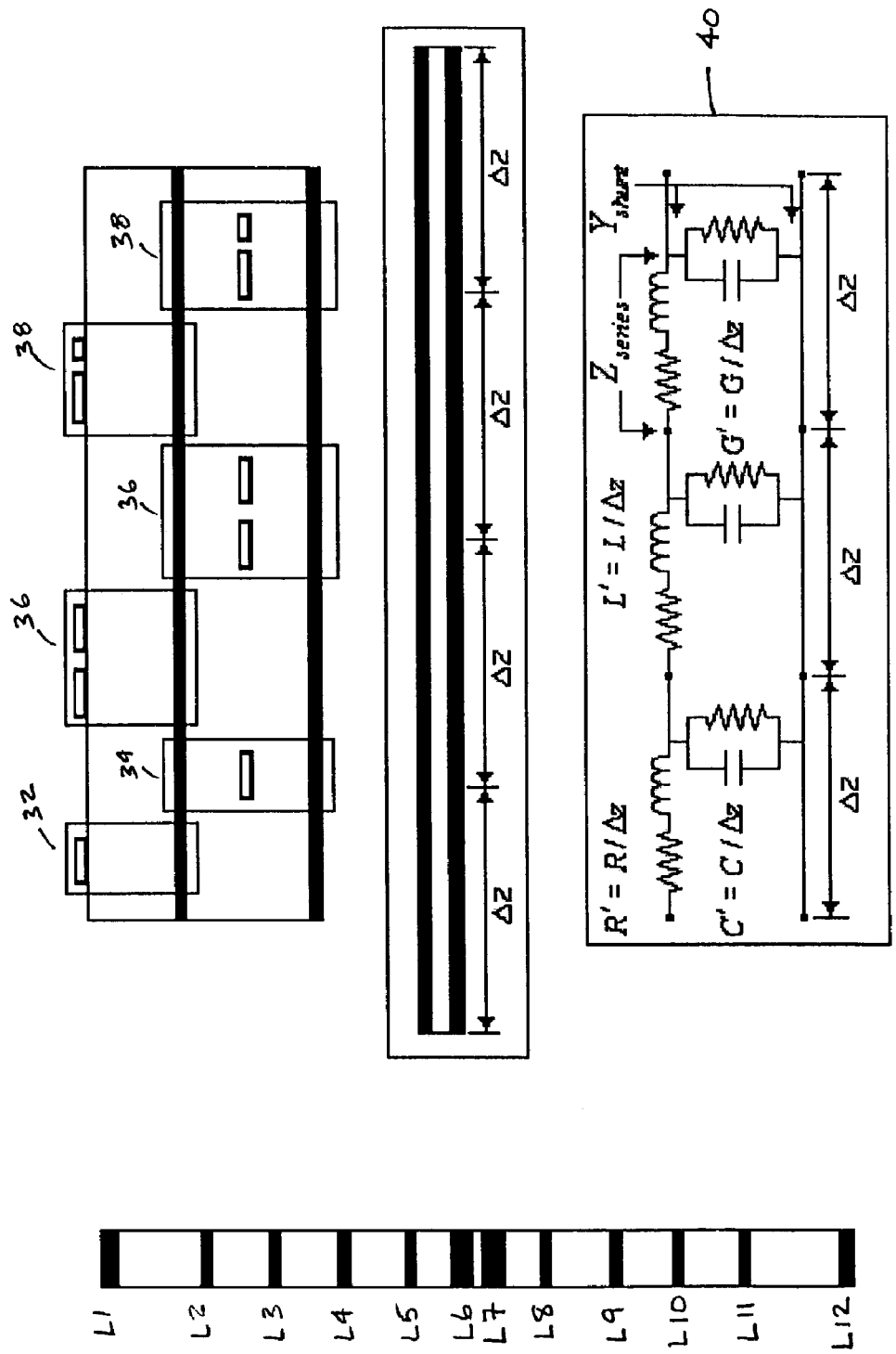
FIG. 4 is a partial cross-sectional view of a printed circuit board showing the views of the single-ended stripline of FIG. 3, as well as, the division of such stripline into identical length segments and its equivalent electrical circuit.

Because microstrips 32 and striplines 34 are uniform guided wave structures (e.g., their cross-sections do not change with distance along the line), they can be used to model the impact of signals propagating down the line through a series of identical lumped-element RLGC circuits 40. As best seen in FIG. 4 and using the single-ended stripline 34 of FIG. 3 as an example, a transmission line is first divided into infinitesimally small increments, $\Delta Z$. An electrically equivalent circuit 40 may be created based on the four physical phenomena all transverse electromagnetic wave mode transmission lines have in common. The series resistance, R, is used to quantify the conversion of signal power into heat inside the conductive regions of the transmission line. The shunt conductance, G, is used to quantify the conversion of signal power into heat inside the dielectric regions of the transmission line. Because transmission lines are guided wave structures, the bulk of the power contained in the propagating signal is in the electric and magnetic fields that exist in the dielectric regions surrounding the conductive portions of the transmission line. The capacitance, C, is used to quantify the impact the transmission line has on the electric field. A similar relationship exists between inductance, L, and the magnetic field. Altering the size and shapes of the conductors and dielectric materials used to create the transmission line will alter the values of R, L, G, and C.

When uniform transmission lines (such as microstrip 32 and stripline 34 interconnect traces) are connected to a via 12, the via 12 and its localized surroundings may be divided into three different vertical regions: one or more bend regions, one or more stub regions, and one or more thru regions. The top and bottom surfaces that comprise these regions depend on the PCB stackup 10 and which layers incoming and outgoing planar transmission lines are routed on. A via bend section is that region of a via 12 connected to a planar transmission line. A bend signifies that the direction of the currents associated with the signal must change directions. In other words, the signal currents flowing horizontally along the interconnect traces must now flow vertically through the via 12. As a general rule, the bend section consists of the vertical section of the via 12 located on the same layers used to create the signal trace transmission line structures. Because microstrip transmission lines 32 need two layers, a bend associated with a microstrip 32 encompasses at least two layers.

Similarly, a via stub section 28 is that portion of a via 12 which has one end that is not terminated. A via thru section or a via bend section cannot be part of a via stub section 28. A via thru section is that portion of the via 12 which is required in order to complete an electrical circuit between an incoming and outgoing signal transmission line but is not part of a bend section. The electric and magnetic fields associated with the signal passing through the via 12 often extend into the regions between the conductive layers beyond the anti-pad boundary 26.

When optimizing a via 12 one must include these regions 26 if the electric and magnetic fields contain a significant percentage of the energy contained in the signal. The penetration distance is dependent on a number of factors including the size and shape of the pad 22 and 24 and anti-pad 26 regions and thickness of both the conductive and dielectric layers in the region of interest. In PCB regions where the via density is high, which is often the case underneath connectors and high pin-count integrated circuits, the electric and magnetic fields generated by adjacent vias 12 can and do co-mingle. In those cases, the optimization of a given via 12 may also require the optimization of adjacent vias 12.

Figure 5:
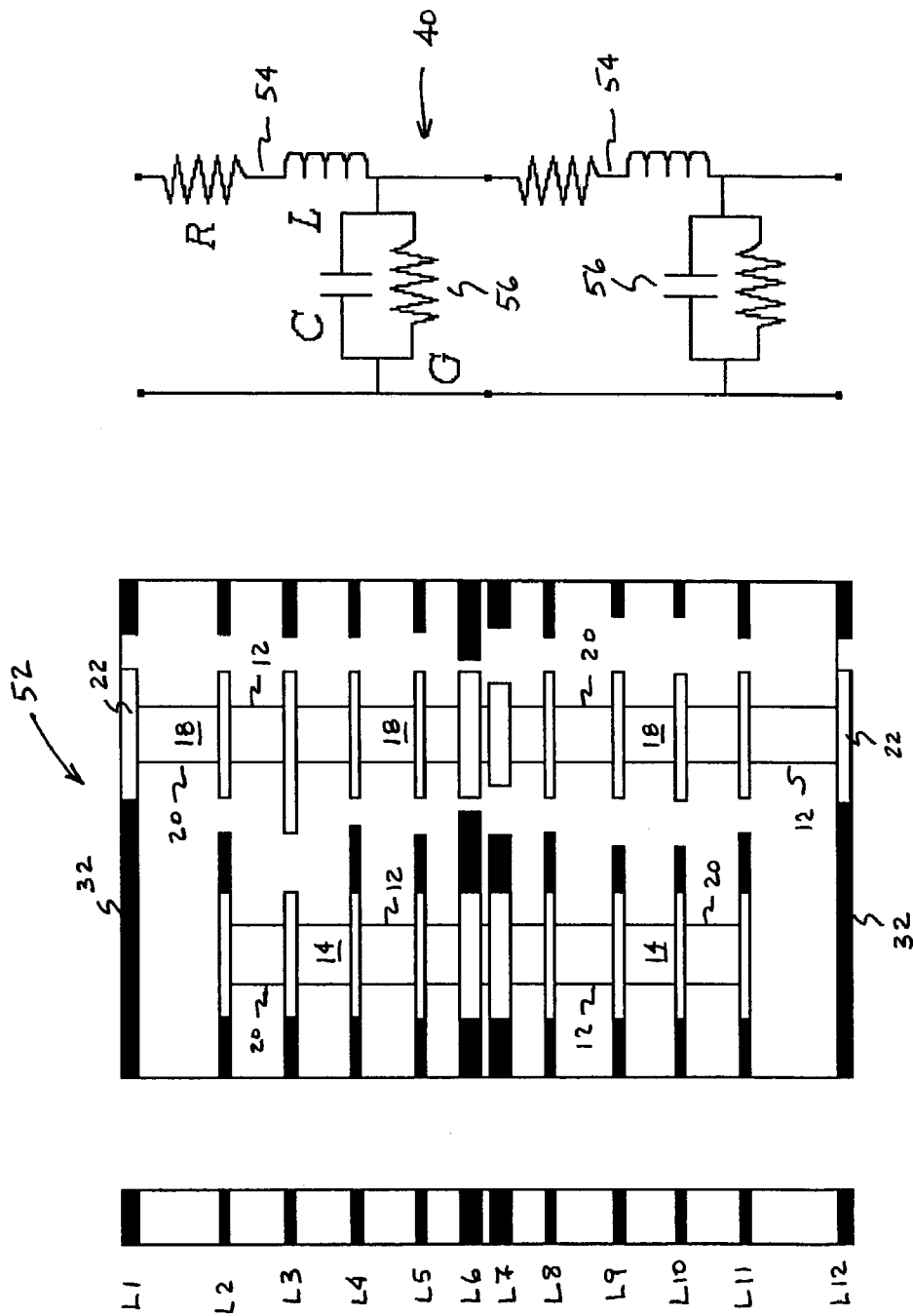
FIG. 5 is a pair of cross-sectional views of a printed circuit board showing the individual internal layers and a corresponding view showing the internal connections between the layers including a via thru section with an adjacent return via, and the equivalent circuit for the plurality of vias.
Figure 6:
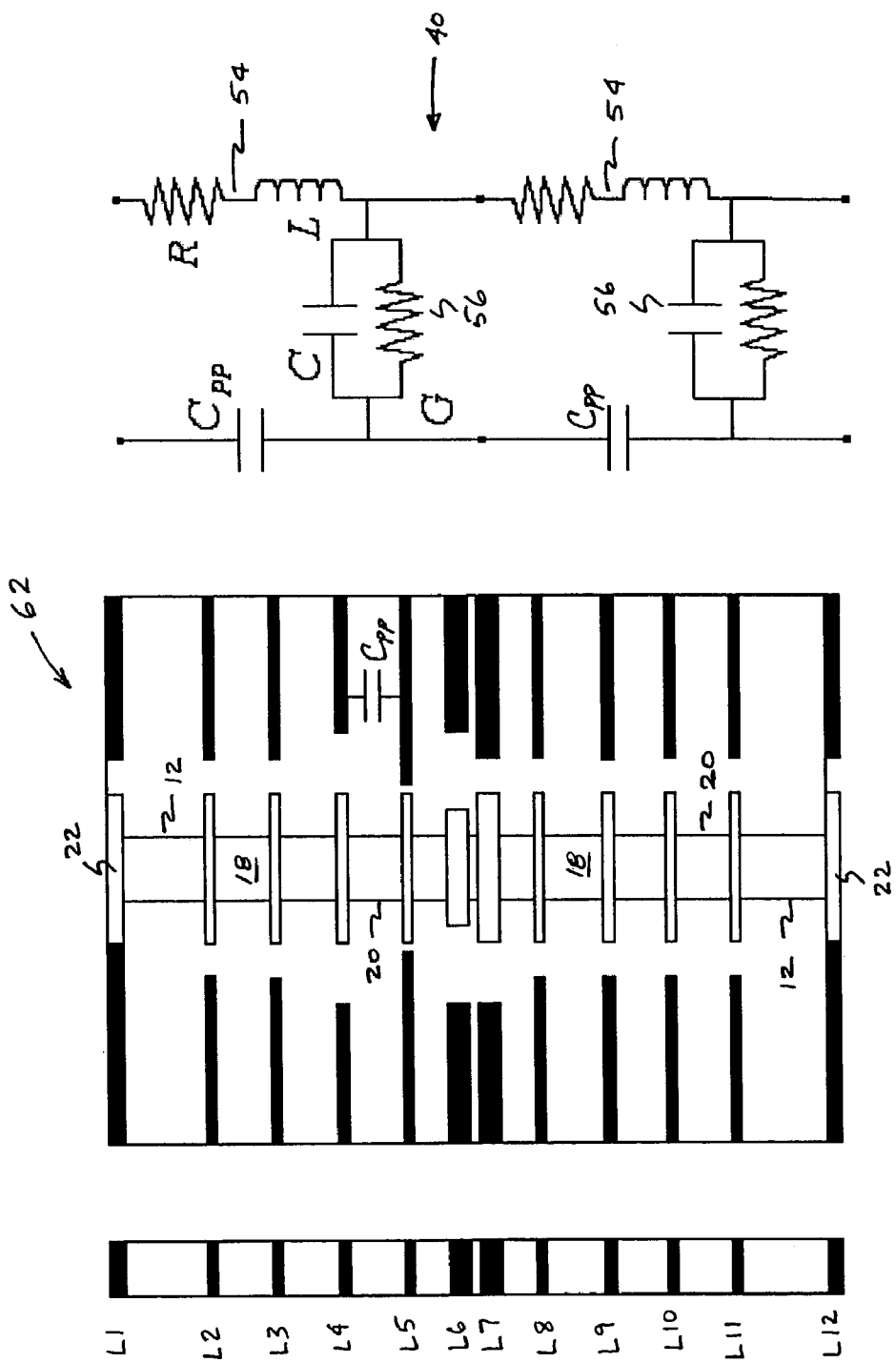
FIG. 6 is a pair of cross-sectional views as in FIG. 5 for a via thru section without an adjacent return via and it's equivalent circuit.

FIG. 5 depicts an example of the conversion of a two via structure 52 into discrete segments for optimization. In this example, two microstrip transmission lines 32 are connected to a plated thru hole (PTH) via 18. A buried via 14 is used to provide a direct current return path for the two microstrip lines 32. The buried via 14 is positioned very close to the PTH via 18 so the electromagnetic fields generated by the currents in the two vias 14 and 18 are coupled. The vertical distance between layers L1 and L2 form a bend region. The vertical distance between layers L11 and L12 form a bend region. The remaining portion of the via 18, layers L2 through L11, form the thru section. There are no stub sections 28 in this configuration. One can define an equivalent circuit 40 for the thru section by dividing up the total height into a chain of series RL segments 54 and shunt GC segments 56. The series R value can be computed from the resistance losses associated with the via segments defined in the region.

The series inductance can be computed from the magnetic field generated by the propagating signal between layers L2 and L3. The shunt capacitance can be computed from the electric field generated by the propagating signal surrounding layer L3. The series impedance increases with the increasing separation between layers. The shunt admittance is dependent on how close the ground plane is to any non-functional pads. The shunt admittance of layer L6 is greater than the shunt admittance of layer L7. The thickness of the conductive planes also impacts the shunt admittance. A thicker conductive layer has a lower admittance. Moving the conductive planes away from non-functional pads 24, or removing a non-functional pad 24 increases the shunt admittance. Since optimization of the thru section generally requires the discretized characteristic impedance between the individual discretized RLGC circuits 40 to be as equal as possible, the pad 22 and 24 and anti-pad 26 diameters must be adjusted as needed to compensate for differences in dielectric material thickness, conductor thickness, etc. If adjustments of the pad/anti-pad diameters do not provide sufficient degrees of freedom, then the dielectric layer heights may require adjustment.

Note that a given transmission line structure is not limited to the four RLGC values noted herein. As long as expressions for series impedance and shunt admittance can be derived, the lumped element characteristic impedance of the transmission line structure can be calculated. As an example, consider the single via structure 62 shown of FIG. 6. In such a case, there is no adjacent DC return current via, and the equivalent circuit 40 includes a series capacitance, $C_{pp}$, that provides a return path for an AC displacement current.

Also note that as the frequency increases, the discretized characteristic impedance approaches that obtained for the two-via case 52 described above. If the DC return via in the two-via case 52 is not in the immediate vicinity of the via 12 being analyzed, then the model defined by FIG. 6 must be used. The important point to make here is that once a given via structure 62 is defined, it is possible to convert it into an discretized non-uniform transmission line structure on which known calculations may be performed to optimize the physical characteristics of the via 12 or collection of vias 12.

Figure 7:
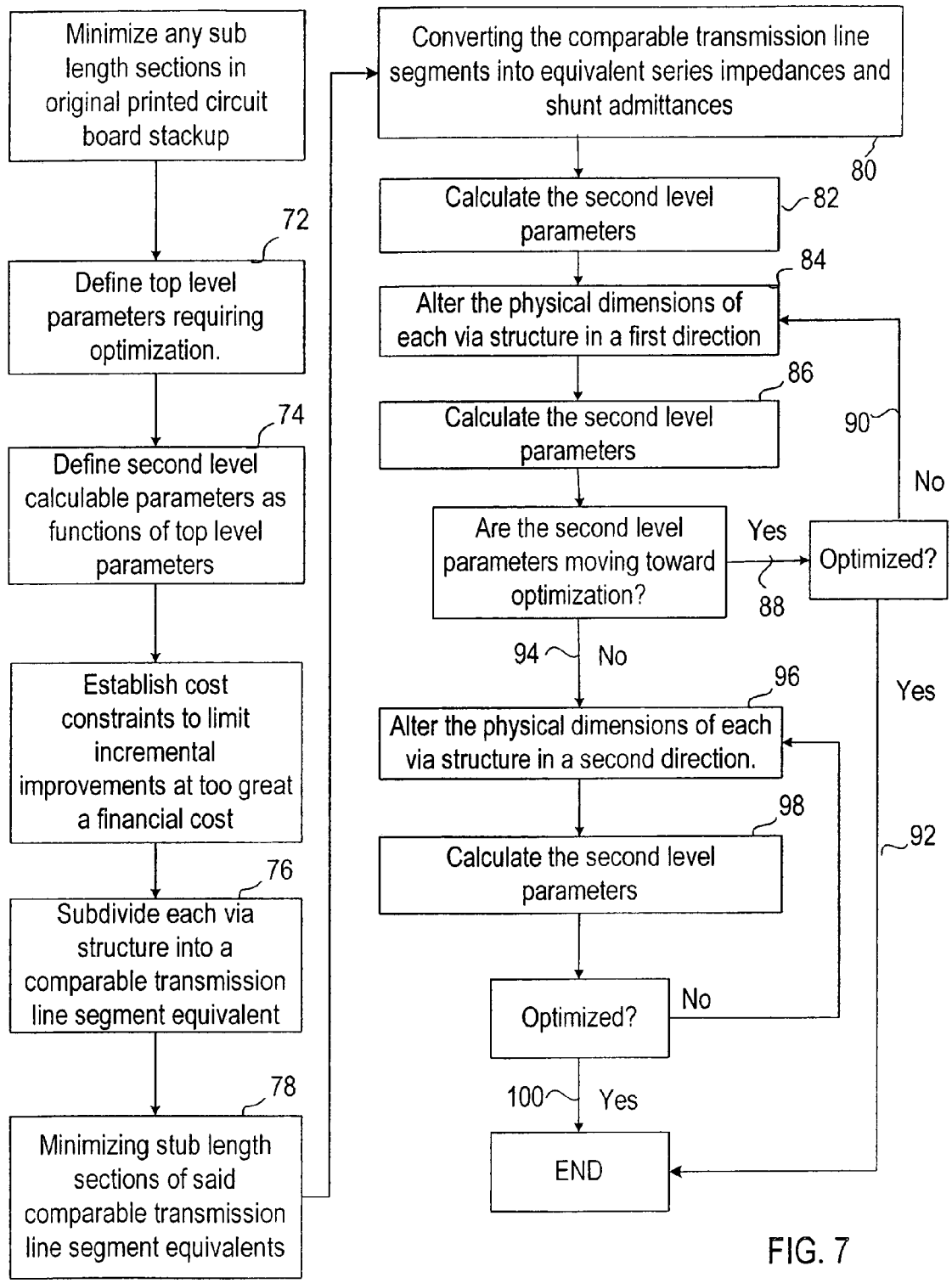
FIG. 7 is a flowchart outlining the basic methodology of the present invention.

FIG. 7 provides a flowchart 70 of the present invention's methodology for optimizing the high frequency performance of via structures 12. As the present invention is primarily concerned with improving signal integrity, the first step of the process 72 is to choose a parameter that may be calculated to evidence improvement in the printed circuit board's signal integrity by manipulating the physical characteristic of the vias 12. One such parameter is the S-parameter. Due to their inherent difficulty to calculate in an iterative process where equivalent electrical representations of physical parameters are being evaluated, the S-parameters are best represented in terms of series impedances, shunt admittances, or series discretized RLGC sub-circuits, where the values of R, L, G, C and the admittances and impedances may be quickly calculated. These may be chosen as the second level parameters 74 to determine optimization.

In order to calculate the second level parameters, the via must be subdivided into one of several types of transmission line segments 76. These include transmission line bend sections, non-uniform transmission line thru sections, and loaded non-uniform transmission line stub sections, as necessary, to generate an electrical circuit equivalent to said at least one via structure. To ease the calculations and reduce reflective signal effects the stub section lengths of the vias should be minimized where possible 78.

The transmission line segments may then be converted 80 into equivalent series impedances, shunt admittances, or and a series of discretized RLGC sub-circuits comprised of one or more resistors, R, inductors, L, conductors, G, and capacitors, C. The second level parameters for these equivalent circuits may be calculated as a baseline 82. The physical characteristics of the vias 12 are then manipulated in a first direction 84 (i.e., increase or decrease the size of the hole or change its shape). The second level parameters are then recalculated 86 to determine if their values are moving in a direction desired by the user.

If the second level parameter values are moving towards an optimized value 88, the physical characteristics of the vias may be further altered in the same manner 90 (i.e., if previously made smaller, make it smaller still) until such time that the calculated values of the second level parameters are either optimized 92 or until further optimization is cost prohibitive. If the second level parameters are not moving towards an optimized value 94, the physical characteristics of the vias may be moved in the other direction 96 (i.e., if made smaller, then make it bigger) until such time the calculated values of the second level parameter are either optimized 100 or until further optimization becomes cost prohibitive. Optionally, the top level parameters may be calculated to ensure a high frequency performance improvement in the printed circuit board through the via's optimization.

Although a preferred embodiment of the invention has been described using specific terms and devices, such description is for illustrative purposes only. The words used are words of description rather than of limitation. It is to be understood that changes and variations may be made by those of ordinary skill in the art without departing from the spirit or the scope of the present invention, which is set forth in the following claims. In addition, it should be understood that aspects of various other embodiments may be interchanged both in whole or in part. Therefore, the spirit and scope of the appended claims should not be limited to the description of the preferred version contained herein.

What is claimed is:

1. A method for optimizing the high frequency performance of at least one via structure having at least one stub, comprising the steps of:
   a) defining a plurality of top level parameters for optimization;
   b) deriving a plurality of second level parameters for optimization and that are monotonic with respect to said top level parameters;
   c) defining economic cost constraints for optimization of said second level parameters;
   d) subdividing said at least one via structure into one of several types of transmission line segments;
   e) minimizing stub section lengths of said at least one via structure;
   f) converting said several types of transmission line segments into equivalent series impedances, and shunt admittances for use as said second level parameters; and
   g) optimizing said second level parameters.

2. The method of claim 1, wherein said top level parameters are the S-parameters of said at least one via structure.

3. The method of claim 1, wherein said several types of transmission line segments include transmission line bend sections, non-uniform transmission line thru sections, and loaded non-uniform transmission line stub sections, as necessary, to generate an electrical circuit equivalent to said at least one via structure.

4. The method of claim 3, wherein said transmission line bend sections are converted into lumped element series impedances and shunt element admittances.

5. The method of claim 4, wherein said non-uniform transmission line thru sections are converted into a series of discretized RLGC sub-circuits.

6. The method of claim 5, wherein said loaded non-uniform transmission line stub sections are converted into a series of discretized RLGC sub-circuits.

7. The method of claim 1, wherein said optimization of said second level parameters includes minimizing the value of the series impedances and shunt admittances of said transmission line bend sections.

8. The method of claim 1, wherein said optimization of said second level parameters involves the manipulation of the physical dimensions of said at least one via structure.

9. A method for optimizing the high frequency performance of at least one via structure, comprising the steps of:
  a) defining a plurality of top level parameters for optimization;
  b) deriving a plurality of second level parameters for optimization and that are monotonic with respect to said top level parameters;
  c) defining economic cost constraints for optimization of said second level parameters;
  d) subdividing said at least one via structure into one of several types of transmission line segments;
  e) minimizing stub section lengths of said at least one via structure;
  f) converting said several types of transmission line segments into equivalent series impedances, and shunt admittances; and
  g) optimizing said second level parameters;
  wherein said several types of transmission line segments include transmission line bend sections, non-uniform transmission line thru sections, and loaded non-uniform transmission line stub sections, as necessary, to generate said equivalent series impedances and said shunt admittances;
  wherein said second level parameters are the values of equivalent lumped element series impedances and shunt;
  wherein said optimization of said second level parameters includes making said equivalent series impedances between adjacent sub-circuits as equal as possible, and making said equivalent shunt admittances between adjacent sub-circuits as equal as possible, and if any one of said equivalent series impedances and shunt admittances between adjacent sub-circuits cannot be made as equal as possible, then making a product of said series equivalent impedances and shunt admittances between adjacent sub-circuits as equal as possible.

10. A method for optimizing the high frequency performance of at least one via structure, comprising the steps of:
  a) defining a plurality of top level parameters for optimization;
  b) deriving a plurality of second level parameters for optimization and that are monotonic with respect to said top level parameters;
  c) defining economic cost constraints for optimization of said second level parameters;
  d) subdividing said at least one via structure into one of several types of transmission line segments;
  e) minimizing stub section lengths of said at least one via structure;
  f) converting said several types of transmission line segments into equivalent series impedances, and shunt admittances; and
  g) optimizing said second level parameters;
  wherein said several types of transmission line segments include transmission line bend sections, non-uniform transmission line thru sections, and transmission line stub sections, as necessary, to generate said equivalent series impedances and said shunt admittances;
  wherein said second level parameters are the values of equivalent lumped element series impedances and shunt admittances.

* * * * *